(12) United States Patent
Wurcer

(10) Patent No.: US 9,136,807 B2
(45) Date of Patent: Sep. 15, 2015

(54) APPARATUS AND METHODS FOR ELECTRONIC AMPLIFICATION

(71) Applicant: ANALOG DEVICES, INC., Norwood, MA (US)

(72) Inventor: Scott A Wurcer, Cambridge, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 41 days.

(21) Appl. No.: 13/943,444

(22) Filed: Jul. 16, 2013

(65) Prior Publication Data

US 2015/0022267 A1    Jan. 22, 2015

(51) Int. Cl.
*H03F 3/45*  (2006.01)
*H03F 1/26*  (2006.01)
*H03F 1/34*  (2006.01)
*H03F 3/08*  (2006.01)

(52) U.S. Cl.
CPC ............ *H03F 3/45273* (2013.01); *H03F 1/26* (2013.01); *H03F 1/34* (2013.01); *H03F 3/087* (2013.01); *H03F 3/45475* (2013.01); *H03F 2200/261* (2013.01); *H03F 2203/45138* (2013.01)

(58) Field of Classification Search
CPC ........................................................ H03F 3/45
USPC ........................................ 330/102, 103, 257
See application file for complete search history.

(56) References Cited

U.S. PATENT DOCUMENTS

| 5,258,723 | A  | * | 11/1993 | Mazzucco et al. | ............ 330/258 |
| 5,627,490 | A  | * | 5/1997  | Sushihara et al. | ............ 327/510 |
| 6,864,724 | B1 | * | 3/2005  | Kim et al. | ..................... 327/103 |
| 2006/0028260 | A1 | * | 2/2006  | Baumgartner | ................ 327/350 |
| 2011/0101208 | A1 | * | 5/2011  | Saito et al. | ................ 250/214 A |

OTHER PUBLICATIONS

Bilotti, Albert, "*Noise Characteristics of Current Mirror Sinks/Sources*", IEEE Journal of Solid-State Circuits, vol. SC-10, No. 6, Dec. 1975, pp. 516-524.

* cited by examiner

*Primary Examiner* — Steven J Mottola
*Assistant Examiner* — Hafizur Rahman
(74) *Attorney, Agent, or Firm* — Knobbe Martens Olson & Bear LLP

(57) ABSTRACT

Apparatus and methods for electronic amplification are provided. In one embodiment, an amplifier includes first and second input terminals, an amplification circuit, a feedback circuit, and a current mirror. The amplification circuit includes a non-inverting voltage input electrically connected to the first input terminal and to a bias voltage, an inverting voltage input electrically connected to the second input terminal, a voltage output, and a current output. The amplifier includes a first feedback path from the voltage output to the inverting voltage input through the feedback circuit and a second feedback path from the current output to the inverting voltage input through the current mirror, which can mirror a current from the current output to generate a mirrored current. A current source such as a transducer can provide an input current between the first and second input terminals, and the mirrored current can substantially match the input current.

23 Claims, 7 Drawing Sheets

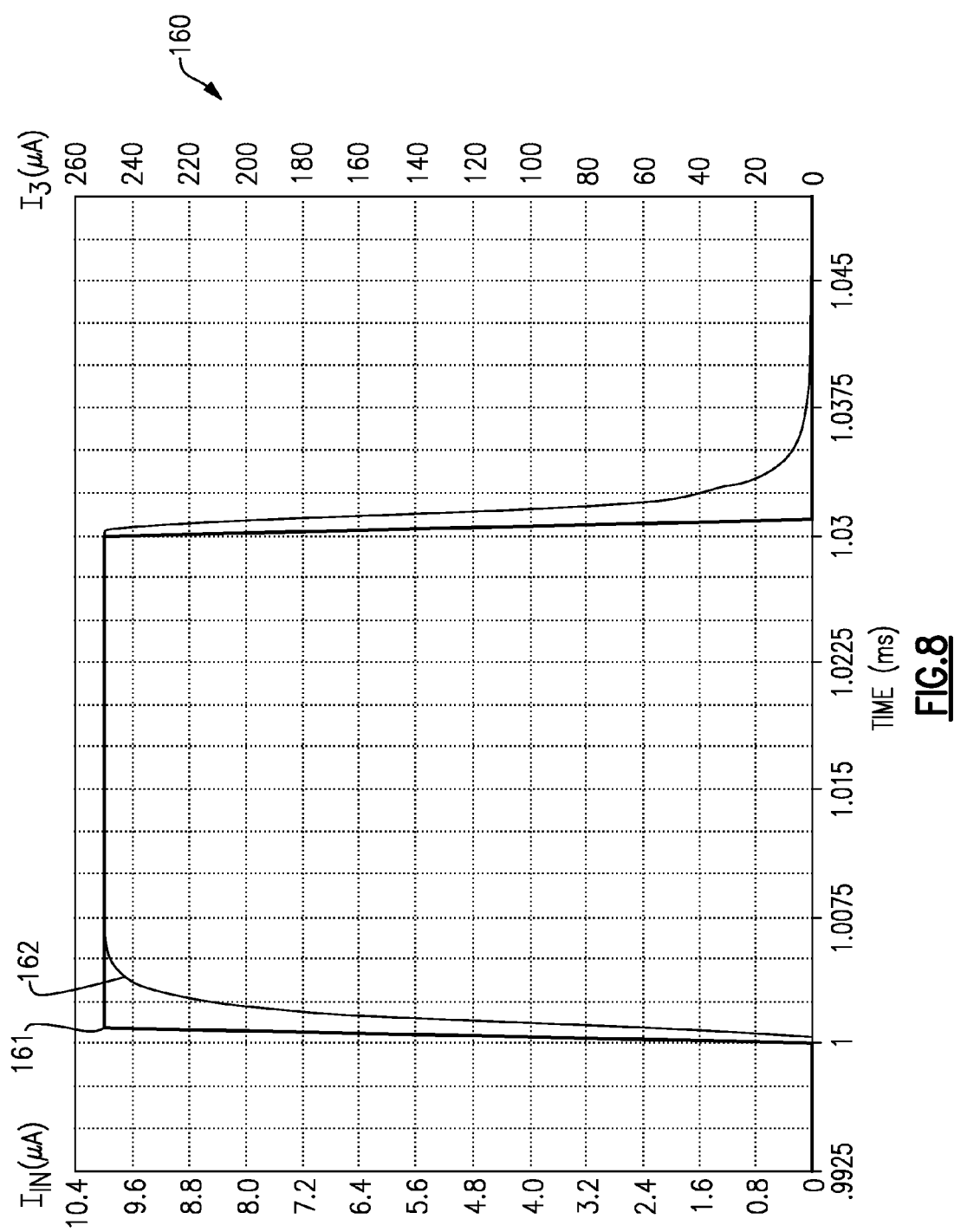

APPARATUS AND METHODS FOR ELECTRONIC AMPLIFICATION

BACKGROUND

1. Field

Embodiments of the invention relate to electronic devices, and more particularly, to amplifiers.

2. Description of the Related Technology

Certain electronic systems can include an amplifier for amplifying a relatively weak signal. For example, an amplifier can be used to amplify an input current signal from a current source, such as a current or charge transducer.

Various operational parameters of an amplifier can impact the overall performance of the electronic system using the amplifier. For example, the amplifier's bandwidth can be important to reliably amplify transient signals such as pulses and/or to maintain amplifier stability when connected using negative feedback. Additionally, an amplifier's noise performance can be important, such as in applications in which a relatively small or weak signal is amplified.

SUMMARY

In one embodiment, an amplifier includes an amplification circuit, a feedback circuit, and a current mirror. The amplification circuit includes a first voltage input, a second voltage input, a voltage output, and a current output, and the amplification circuit is configured to control a voltage level of the voltage output by amplifying a voltage difference between the first and second voltage inputs. The amplification circuit is further configured to generate a first current on the current output based on the voltage difference between the first and second voltage inputs. The feedback circuit is electrically connected between the voltage output of the amplification circuit and the second voltage input of the amplification circuit. The current mirror includes a current input electrically connected to the current output of the amplification circuit and a first current output electrically connected to the second voltage input of the amplification circuit. The current mirror is configured to receive the first current at the current input and to mirror the first current to generate a second current at the first current output.

In another embodiment, an electronically-implemented method of amplification is provided. The method includes receiving an input current between a first input terminal and a second input terminal and amplifying a voltage difference between the first input terminal and the second input terminal to generate an amplified voltage using an amplification circuit. The amplification circuit includes a first voltage input electrically connected to the first input terminal, a second voltage input electrically connected to the second input terminal, a voltage output for providing the amplified voltage, and a current output. The method further includes generating a first current on the current output of the amplification circuit based on the voltage difference between the first input terminal and the second input terminal, providing voltage feedback from the voltage output of the amplification circuit to the second voltage input of the amplification circuit using a feedback circuit, and providing current feedback from the current output of the amplification circuit to the second voltage input of the amplification circuit by using a current mirror to mirror the first current to generate a second current substantially equal to the input current.

In another embodiment, an apparatus includes a means for amplifying, a feedback capacitor, and a means for mirroring current. The amplifying means includes a first voltage input, a second voltage input, a voltage output, and a current output. The feedback capacitor is electrically connected between the voltage output of the amplifying means and the second voltage input of the amplifying means. The current mirroring means includes a current input and a current output. The current input of the current mirroring means is electrically connected to the current output of the amplifying means, and the current output of the current mirroring means is electrically connected to the second voltage input of the amplifying means.

BRIEF DESCRIPTION OF THE DRAWINGS

FIG. 8 is a graph of current versus time for one implementation of an amplifier.

DETAILED DESCRIPTION OF EMBODIMENTS

Figure 1:
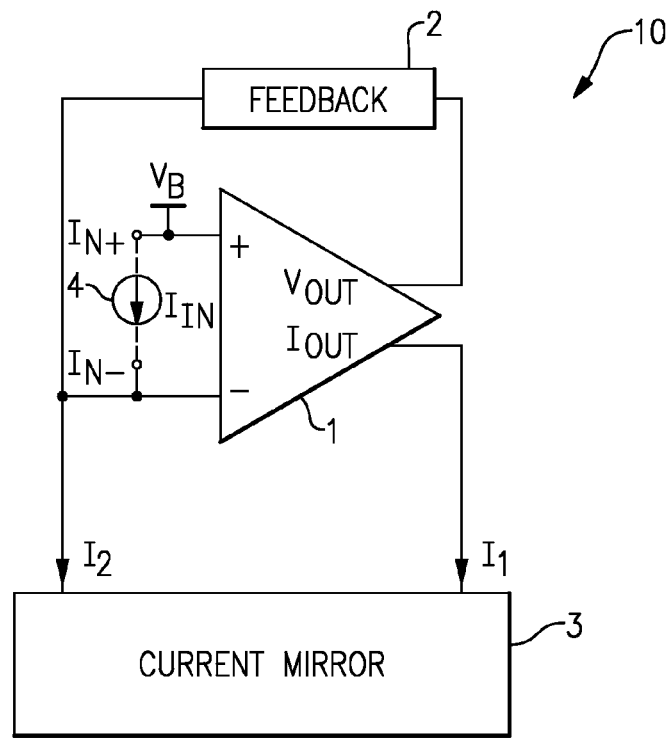
FIG. 1 is a circuit diagram of an amplifier according to one embodiment.

The following detailed description of certain embodiments presents various descriptions of specific embodiments of the invention. However, the invention can be embodied in a multitude of different ways as defined and covered by the claims. In this description, reference is made to the drawings where like reference numerals may indicate identical or functionally similar elements.

A voltage feedback amplifier can refer to an amplifier connected in a closed-loop configuration in which the error signal is a voltage signal. In contrast, a current feedback amplifier can refer to an amplifier connected in a closed-loop configuration in which the error signal is a current signal. In certain implementations described herein, an amplifier includes both voltage feedback and current feedback.

Apparatus and methods for electronic amplification are provided. In one embodiment, an amplifier includes first and second input terminals, an amplification circuit, a feedback circuit, and a current mirror. The amplification circuit includes a first or non-inverting voltage input electrically connected to the first input terminal and to a bias voltage, a second or inverting voltage input electrically connected to the second input terminal, a voltage output, and a current output. The amplifier includes a first feedback path from the voltage output to the inverting voltage input through the feedback circuit, which can include, for example, a feedback capacitor. The amplifier further includes a second feedback path from the current output to the inverting voltage input through the current mirror, which can replicate or mirror a current from the amplification circuit's current output to generate a mirrored current. In certain implementations, the amplifier receives an input current between the first and second input terminals from a current source such as a transducer, and the amplifier's negative feedback controls the mirrored current to substantially match or equal the input current.

The amplifier can be implemented in a wide variety of configurations, including, for example, as a logarithmic (log) amplifier, a current amplifier, or a transimpedance amplifier. For example, in some configurations, the current mirror is implemented using a diode and a bipolar transistor, with the diode configured to receive the current from the amplification circuit and with the diode electrically connected between the base and emitter of the bipolar transistor. In such a configuration, the diode's anode voltage can be provided as a voltage output that changes in relation to a logarithm of the input current. Additionally, the dual-feedback configuration of the amplifier can result in the amplifier having a substantially constant bandwidth in response to changes in the level of the input current.

Additionally, in certain configurations, the current mirror can be implemented to include an additional current output, which can be used to generate an amplified or buffered current. The amplified current can serve as an output to the amplifier such that the amplifier operates as a current amplifier. In other configurations, the amplified current is converted into a voltage, and the amplifier operates as a transimpedance amplifier that has improved bandwidth and/or noise performance relative to certain conventional transimpedance amplifiers.

The amplifiers provided herein can be used in a wide variety of applications, including, for example, instrumentation and/or medical applications. In one example, the amplifier is configured as a transimpedance amplifier and is used to amplify a photocurrent from a photodiode. The transimpedance amplifier can have substantially constant bandwidth versus input current level, and thus can be used to reliably amplify current pulse signals even when the photodiode is in a low ambient or background light condition.

In one embodiment, an amplifier has "substantially constant bandwidth versus input current level" when the bandwidth of the amplifier varies by less than about 50% across a range of input current spanning at least 3 decades of current.

FIG. 1 is a circuit diagram of an amplifier 10 according to one embodiment. The amplifier 10 includes a first input terminal IN+, a second input terminal IN−, an amplification circuit 1, a feedback circuit 2, and a current mirror 3. FIG. 1 has been annotated to illustrate a current source 4 for providing an input current $I_{IN}$ from the first input terminal IN+ to the second input terminal IN− of the amplifier 10.

The amplification circuit 1 includes a first or non-inverting voltage input (+), a second or inverting voltage input (−), a voltage output $V_{OUT}$, and a current output $I_{OUT}$. As shown in FIG. 1, the first and second input terminals IN+, IN− are electrically connected to the amplification circuit's non-inverting and inverting voltage inputs, respectively. Additionally, the non-inverting voltage input of the amplification circuit 1 is electrically connected to a bias voltage $V_B$. The feedback circuit 2 is electrically connected between the amplification circuit's voltage output $V_{OUT}$ and inverting voltage input. The current mirror 3 includes a current input electrically connected to the amplification circuit's current output $I_{OUT}$ and a first current output electrically connected to the amplification circuit's inverting voltage input.

The amplification circuit 1 of FIG. 1 includes both a voltage output $V_{OUT}$ and a current output $I_{OUT}$. The amplification circuit 1 can amplify a voltage difference between the amplification circuit's non-inverting and inverting voltage inputs to generate an amplified voltage on the voltage output $V_{OUT}$. Additionally, the amplification circuit 1 can generate a first current $I_1$ based on a voltage difference between amplification circuit's non-inverting and inverting voltage inputs and a transconductance of the amplification circuit 1.

The first current $I_1$ generated by the amplification circuit 1 can be provided to the current mirror 3, which can replicate or mirror the first current $I_1$ to generate a second or mirrored current $I_2$. The current mirror 3 can have any suitable gain, such as a gain selected to meet performance specifications. In one embodiment, the current mirror 3 is configured to control the magnitude of the second current $I_2$ to be about equal to $m*I_1$, where m is a factor selected to be in the range of about 0.05 to about 0.2. However, other configurations are possible.

As shown in FIG. 1, the current source 4 can be electrically connected between the amplifier's first and second input terminals IN+, IN−, and can provide the input current I to the amplifier 10. The current source 4 can represent a wide variety of devices, including, for example, a current or charge transducer, such as a photodiode. In certain configurations, the amplifier 10 is fabricated on an integrated circuit (IC), and the current source 4 is external to the IC and provides the input current $I_{IN}$ to the IC's pins or pads. However, other configurations are possible, including, for example, configurations in which the current source 4 is integrated with the amplifier 10. For example, in one embodiment, the current source 4 includes one or more photodiodes fabricated on a common IC with the amplifier 10.

The amplifier 10 includes a first feedback loop or path from the amplification circuit's voltage output $V_{OUT}$ to the inverting voltage input via the feedback circuit 2. Additionally, the amplifier 10 includes a second feedback loop or path from the amplification circuit's current output $I_{OUT}$ to the inverting voltage input via the current mirror 3.

The first and second feedback loops can provide negative feedback that can control the voltages of the amplification circuit's non-inverting and inverting voltage inputs to be about equal. In certain configurations, the feedback circuit 2 is configured to have relatively high impedance at low frequencies, such as DC. In such configurations, the feedback path through the current mirror 3 can result in the second current $I_2$ matching or being about equal to the input current $I_{IN}$. Configuring the amplifier 10 to include dual-feedback can enhance the amplifier's bandwidth and/or noise characteristics.

As will be described in detail below with respect to FIGS. 2-6B, the amplifier 10 can be implemented in a variety of configurations, including, for example, logarithmic amplifier (log-amp), current amplifier, or transimpedance amplifier configurations.

For example, in certain implementations, the current mirror 3 is implemented to include a diode, and a voltage across the diode can change in relation to a logarithm of the input current $I_{IN}$. In such a configuration, the amplifier 10 can operate as a log amplifier that has a bandwidth that is substantially constant across various input current levels.

Additionally, in certain implementations, the current mirror 3 can include a second current output that generates an amplified version of the input current $I_{IN}$. The amplified current can serve as the amplifier's output such that the amplifier operates as a current amplifier and/or can be provided to a current-to-voltage conversion circuit such that the amplifier operates as a transimpedance amplifier.

Thus, the amplifier 10 of FIG. 1 can be implemented in a variety of configurations.

Figure 2:
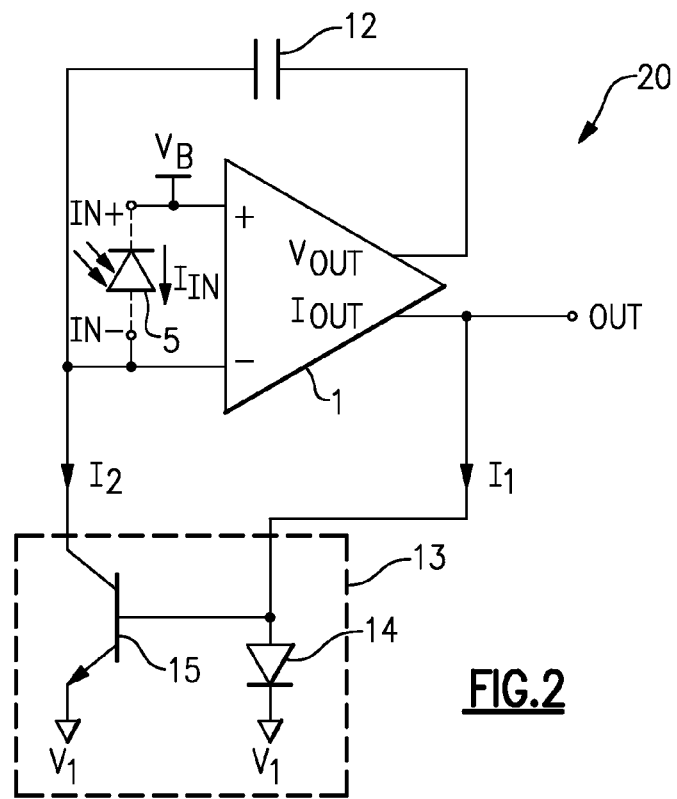
FIG. 2 is a circuit diagram of a logarithmic (log) amplifier according to one embodiment.

FIG. 2 is a circuit diagram of a logarithmic (log) amplifier 20 according to one embodiment. The log amplifier 20 includes the first and second input terminals IN+, IN− and the amplification circuit 1, which can be as described earlier. The log amplifier 20 further includes an output terminal OUT, a feedback capacitor 12, and a current mirror 13.

The illustrated log amplifier 20 is shown as receiving an input current $I_{IN}$ from a photodiode 5. However, other configurations are possible, including, for example, implementations in which the log amplifier 20 receives the input current $I_{IN}$ from other kinds of current sources.

The feedback capacitor 12 is electrically connected between the amplification circuit's voltage output $V_{OUT}$ and the amplification circuit's inverting voltage input. The feedback capacitor 12 can be used to control or tune the log amplifier's closed-loop transfer function. For example, the feedback capacitor 12 can provide loop stability and/or to avoid overshoot in response to transient input signals. The feedback capacitor 12 illustrates one example of the feedback circuit 2 of FIG. 1. However, other configurations of feedback circuits are possible. For example, in one embodiment a feedback circuit includes a resistor and a capacitor in series. Additionally, other configurations are possible, such as feedback circuits selected to obtain a desired amplifier transfer function response.

The current mirror 13 includes a diode 14 and an NPN bipolar transistor 15. The diode 14 includes an anode electrically connected to the current output $I_{OUT}$ of the amplification circuit 1, to the output terminal OUT, and to a base of the NPN bipolar transistor 15. The diode 14 further includes a cathode electrically connected to a first reference voltage $V_1$, which can be, for example, a power low or ground supply. The NPN bipolar transistor 15 further includes an emitter electrically connected to the first reference voltage $V_1$ and a collector electrically connected to the amplification circuit's inverting voltage input.

In one embodiment, the diode 14 is implemented as a diode-connected bipolar transistor. For example, the diode 14 can be implemented using an NPN bipolar transistor in which the emitter operates as the diode's cathode and in which the collector and base are electrically connected together and operate as the diode's anode. The diode 14 is configured to receive the first current $I_1$.

The log amplifier 20 can be used to control a voltage of the output terminal OUT to change in response to a logarithm of the input current $I_{IN}$. For example, as persons having ordinary skill in the art will appreciate, the base-emitter voltage of a bipolar transistor is related to the logarithm of the transistor's collector current. Although not illustrated in FIG. 2 for clarity, the log amplifier 20 can include scaling and/or temperature correction to enhance the accuracy of the log amplifier's log function.

In the illustrated configuration, the photodiode 5 has been connected between the first and second input terminals IN+, IN−, and the input current $I_{IN}$ can correspond to the photodiode's photocurrent. Thus, in the illustrated configuration, the voltage of the output terminal OUT can change in relation to a logarithm of the photodiode's photocurrent. However, other implementations are possible, including, for example, configurations in which the log amplifier 20 is arranged in other ways and/or configured to receive the input current $I_{IN}$ from a different source.

A conventional log amplifier can have a bandwidth that undesirably changes in response to changes in the input current level. When such a log amplifier is used to amplify a photodiode's photocurrent, the log amplifier's bandwidth can depend on the photodiode's ambient or background light level. Such variation in bandwidth with input current level can hinder the operation of the log amplifier, and can result in the log amplifier having insufficient bandwidth to operate in certain lighting conditions. For example, when a photodiode operates in a low background light level, a conventional log amplifier's bandwidth can be relatively small, and may be unsuitable for amplifying certain pulsed or transient photocurrent signals. For instance, a conventional log amplifier may have insufficient bandwidth at low background light levels to properly amplify input signals associated with pulse oximetry testing.

In contrast, the log amplifier 20 of FIG. 2 can have a bandwidth that is substantially constant in response to changes in the level of the input current $I_{IN}$.

For example, in one embodiment, the log amplifier 20 of FIG. 2 can have a transfer function in the Laplace or s-domain given by Equation 1 below, in which $V_O$ is the voltage of the output terminal OUT, $I_{IN}$ is the input current $I_{IN}$, C is the input capacitance of the log amplifier 20 including the capacitance of the photodiode 5, $C_f$ is the capacitance of the feedback capacitor 12, G is a net ratio of the second current $I_2$ to the voltage of the output terminal OUT, and $A_o$ is a parameter related to the unity gain bandwidth $f_0$ of the amplification circuit 1. For example, when $s=j*2*\pi*f_o$, $A_o/s$ can have a magnitude of about 1.

$$\frac{V_o}{I_{IN}} = \frac{-A_o/C}{s^2 + A_o * C_f * s/C + A_o * G/C} \qquad \text{Equation 1}$$

Equation 1 can correspond to one example of the transfer function of the log amplifier 20 of FIG. 2 using a mathematical model neglecting certain parasitic effects and representing the amplification circuit 1 using a single-pole model or $A_o/s$ transfer function. However, persons having ordinary skill in the art will appreciate that other equations for the amplifier's transfer function are possible, such as equations based on different mathematical models, assumptions, and/or constraints.

As shown in Equation 1, the log amplifier 20 can have a frequency response having a bandwidth that is independent of the input current $I_{IN}$. Based on design constraints, the values of various parameters of the log amplifier 20, such as the input capacitance C, the feedback capacitance $C_f$, the factor G and/or the parameter $A_o$, can be selected to tune the frequency response to have a desired characteristic. Although the bandwidth of the transfer function shown in Equation 1 can be independent of the input current $I_{IN}$, in certain configurations, parasitic effects such as additional poles of the current mirror 13 at low input current levels can result in the level of the input current impacting the bandwidth. Accordingly, in certain implementations, the log amplifier 20 has substantially constant bandwidth versus input current level when the bandwidth of the log amplifier 20 varies by less than about 50% across a range of input current spanning at least 3 decades of current.

In contrast, certain conventional log amplifiers have a gain that rolls-off at a frequency dependent on an input current level. Although a compensation capacitor can be used to obtain a desired bandwidth at a particular input current level in a conventional log amplifier, the log amplifier's bandwidth can change when the input current level changes. The change in bandwidth can result in the log amplifier having insufficient bandwidth to amplify certain transient signals, such as current pulses associated with pulse oximetry. Furthermore, the change in bandwidth can result in peaking or even oscillation at certain input current levels, such as high input current levels. Such behavior can be highly undesirable in applications using pulsed or modulated input currents.

Figure 3:
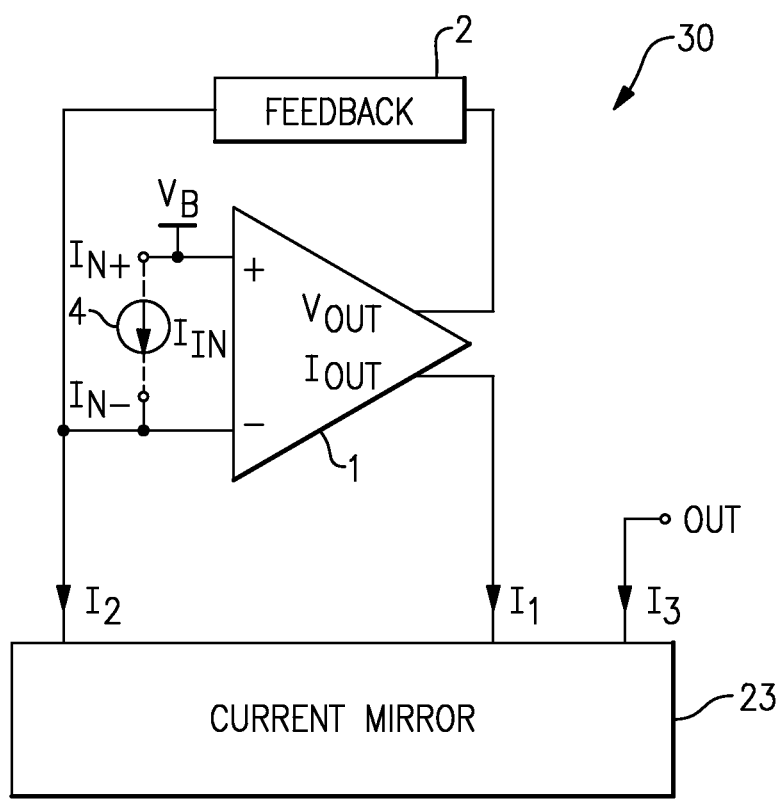
FIG. 3 is a circuit diagram of a current amplifier according to one embodiment.

FIG. 3 is a circuit diagram of a current amplifier 30 according to one embodiment. The current amplifier 30 includes the first and second input terminals IN+, IN−, the amplification circuit 1, and the feedback circuit 2, which can be as described earlier. The current amplifier 30 further includes an output terminal OUT and a current mirror 23. The current mirror 23 of FIG. 3 is similar to the current mirror 3 of FIG. 1, except that the current mirror 23 further includes a second current output electrically connected to the output terminal OUT.

The current amplifier 30 can be used to amplify an input current $I_{IN}$ received between the first and second input terminals IN+, IN−, and to generate a third current $I_3$ as an output. The third current $I_3$ can be amplified based on a gain of the current mirror 23. For example, the current mirror 23 can include transistors used to mirror the first current $I_1$ to generate the third current $I_3$, and a gain of the current mirror 23 can be controlled by selection of the relative width or drive strength of the current mirror transistors. In one embodiment, the third current $I_3$ is configured to be about equal to $n*I_1$, where n is a factor selected to be in the range of about 25 to about 100. Although one example of current mirror gain has been provided, other gain values can be used.

The current amplifier 30 can be used to generate the third current $I_3$, which can correspond to a replica of the amplifier's input current $I_{IN}$. The third current $I_3$ can have a controlled gain relative to the amplifier's input current $I_{IN}$. Additionally, the third current $I_3$ can be provided to one or more loads while avoiding loading of the current source 4.

Figure 4A:
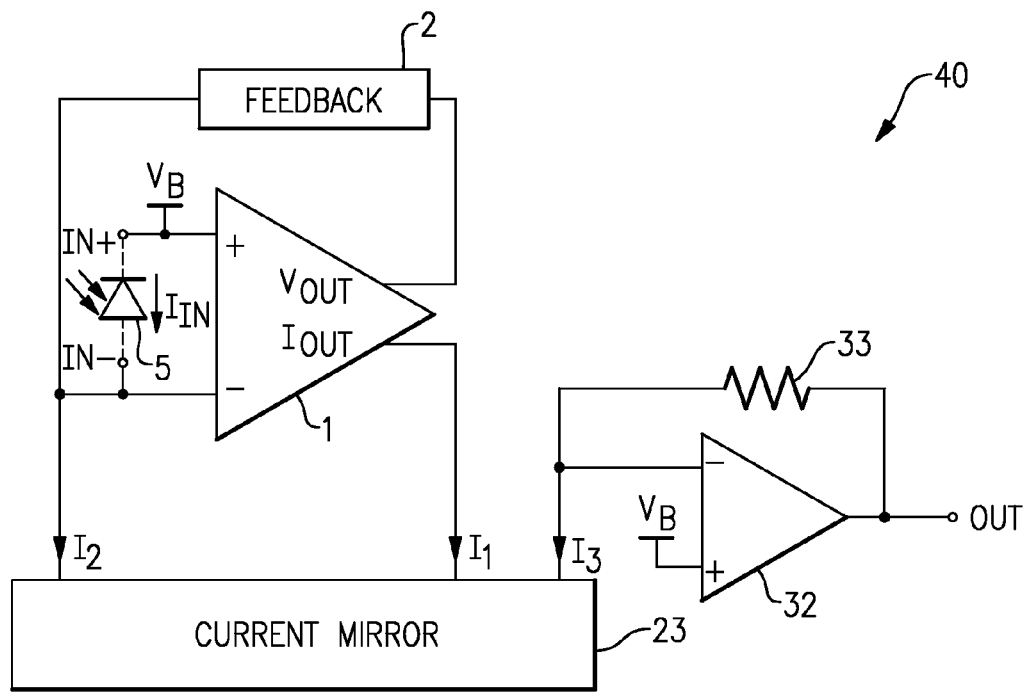
FIG. 4A is a circuit diagram of a transimpedance amplifier according to one embodiment.

FIG. 4A is a circuit diagram of a transimpedance amplifier 40 according to one embodiment. The transimpedance amplifier 40 includes the first and second input terminals IN+, IN−, the amplification circuit 1, the feedback circuit 2, and the current mirror 23, which can be as described earlier. The transimpedance amplifier 40 further includes an output amplification circuit 32, a feedback resistor 33, and an output terminal OUT.

The output amplification circuit 32 includes a non-inverting voltage input electrically connected to the bias voltage $V_B$, an inverting voltage input electrically connected to the second current output of the current mirror 23, and a voltage output electrically connected to the output terminal OUT. As shown in FIG. 4A, the feedback resistor 33 is electrically connected between the voltage output and the inverting voltage input of the output amplification circuit 32.

The transimpedance amplifier 40 can provide an output voltage that changes in relation to the input current $I_{IN}$. For example, the third current $I_3$ can flow through the feedback resistor 33, and can have a magnitude about equal to $n*I_{IN}$, where n is the gain of the current mirror 23 from the current mirror's current input to second current output. Since the output amplification circuit 32 is connected with negative feedback, the voltage of the output terminal OUT can be about equal to $V_B+n*R_F*I_{IN}$, where $V_B$ is the voltage of the bias voltage $V_B$ and $R_F$ is the resistance of the feedback resistor 33.

Although FIG. 4A illustrates a configuration in which a common bias voltage $V_B$ is provided to both the non-inverting voltage input of the amplification circuit 1 and to the non-inverting voltage input of the output amplification circuit 32, the teachings herein are applicable to other configurations, such as implementations in which the amplification circuit 1 and the output amplification circuit 32 receive different bias voltages.

The transimpedance amplifier 40 can be used in a variety of applications. In certain implementations, the transimpedance amplifier 40 can receive current from a high impedance transducer such as the photodiode 5, which can generate a photocurrent in response to incident light flux. In such a configuration, the transimpedance amplifier 40 can generate an amplified buffered voltage on the output terminal OUT, which can be provided, for example, to an input of an analog-to-digital converter (ADC) for further processing. Although FIG. 4A illustrates a configuration in which the transimpedance amplifier 40 receives the input current $I_{IN}$ from the photodiode 5, the transimpedance amplifier 40 can receive the input current $I_{IN}$ from other kinds of sources.

Figure 4B:
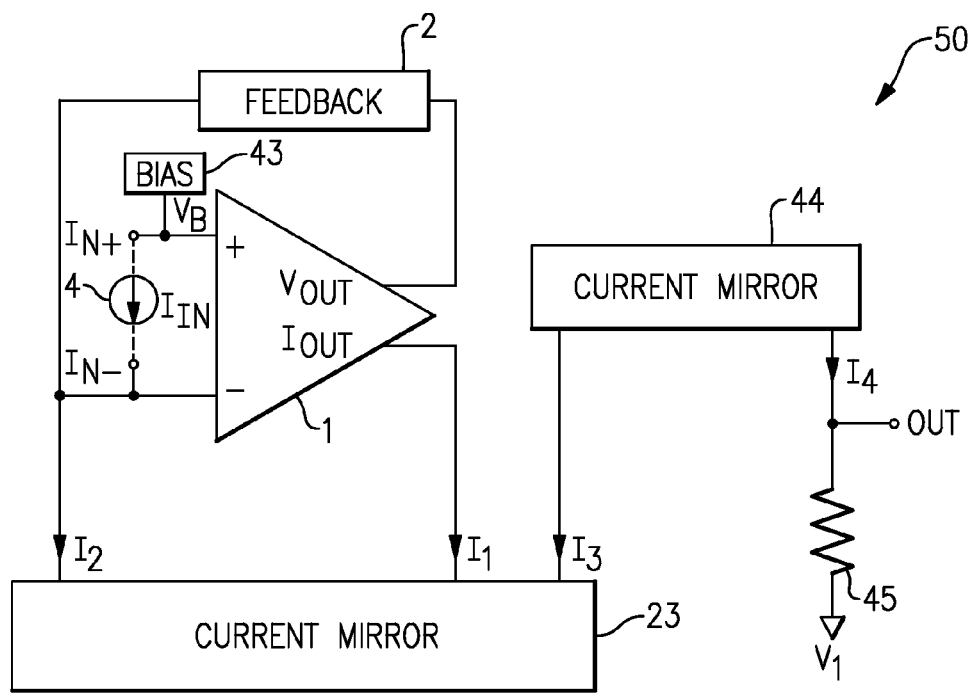
FIG. 4B is a circuit diagram of a transimpedance amplifier according to another embodiment.

FIG. 4B is a circuit diagram of a transimpedance amplifier 50 according to another embodiment. The transimpedance amplifier 50 includes the first and second input terminals IN+, IN−, the amplification circuit 1, the feedback circuit 2, and the current mirror 23, which can be as described earlier. The transimpedance amplifier 50 further includes a bias circuit 43, an output current mirror 44, and an output resistor 45.

The output current mirror 44 includes a current input configured to receive the third current $I_3$ from the second current output of the current mirror 23. The output current mirror 44 further includes a current output electrically connected to the output terminal OUT and configured to generate a fourth current $I_4$. The output resistor 45 is electrically connected between the output terminal OUT and the first voltage reference $V_1$. The fourth current $I_4$ can flow through the output resistor 45 to generate a voltage on the output current OUT that changes in response to the transimpedance amplifier's input current.

In the illustrated configuration, the transimpedance amplifier 50 includes the bias circuit 43 for generating the bias voltage $V_B$. The teachings herein are applicable to configurations in which an amplifier includes bias circuitry for generating bias voltages, such as the bias voltage $V_B$. However, in other configurations, one or more bias voltages can be provided in other ways, such as by circuitry external to the amplifier.

FIGS. 4A and 4B illustrate two examples of transimpedance amplifiers in accordance with the teachings herein. However, other configurations are possible. For example, in one embodiment, an output resistor is electrically connected between the second current output of the current mirror 23 and a power high supply, and the third current $I_3$ is configured to flow through the output resistor to generate an output voltage referenced to the power high supply. Thus, the teachings herein are applicable to a wide variety of amplifier configurations.

Figure 5A:
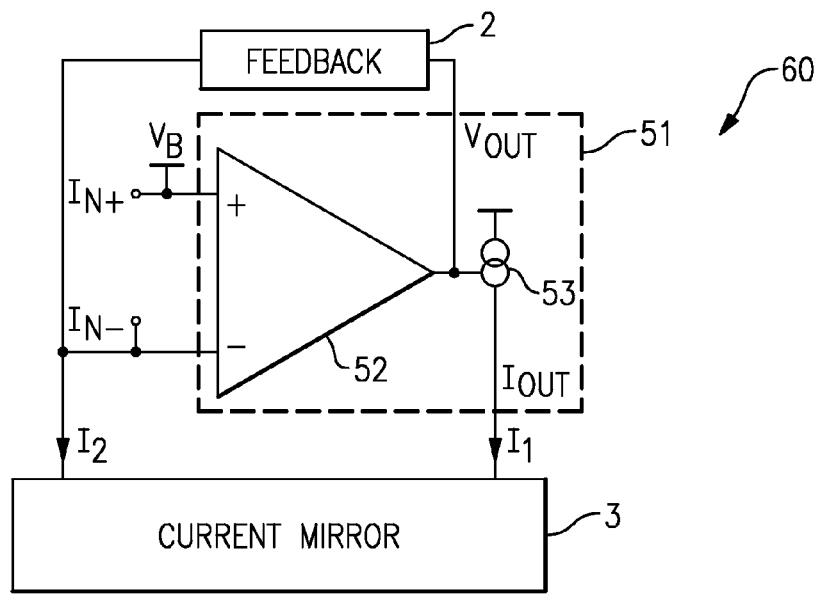
FIG. 5A is a circuit diagram of an amplifier according to another embodiment.

FIG. 5A is a circuit diagram of an amplifier 60 according to another embodiment. The amplifier 60 includes the first and second input terminals IN+, IN−, the feedback circuit 2, and the current mirror 3, which can be as described earlier. The amplifier 60 further includes an amplification circuit 51, which includes an operational amplifier 52 and a transconductance circuit 53. The amplification circuit 51 of FIG. 5A illustrates one embodiment of the amplification circuit 1 of FIGS. 1-4B. However, other implementations are possible.

The operational amplifier 52 includes a first or non-inverting voltage input that operates as the amplification circuit's non-inverting voltage input, a second or inverting voltage input that operates as the amplification circuit's inverting voltage input, and a voltage output that operates as the amplification circuit's voltage output $V_{OUT}$. The transconductance circuit 53 includes a voltage input electrically connected to the voltage output of the operational amplifier 52, and a current output configured to operate as the amplification circuit's current output $I_{OUT}$.

The transconductance circuit 53 can generate the first current $I_1$ such that the first current $I_1$ is about equal to $G_A * V_{OUT}$, where $G_A$ is the transconductance of the transconductance circuit 53 and $V_{OUT}$ is the voltage of the amplification circuit's voltage output $V_{OUT}$. The transconductance $G_A$ can be selected to control the magnitude of the current through the current mirror 3 and/or to control a gain of the feedback loop from the amplification circuit's current output $I_{OUT}$ to inverting voltage input.

In one embodiment, the operational amplifier 52 is configured to have a DC gain of at least about 10,000 and the transconductance circuit 53 is configured to have a transconductance in the range of about 100 μA/V to about 400 μA/V. Although one example of suitable gain and transconductance values has been provided, other values are possible.

Although FIG. 5A illustrates one possible implementation of an amplification circuit that includes both a voltage output $V_{OUT}$ and a current output $I_{OUT}$, other implementations are possible.

Figure 5B:
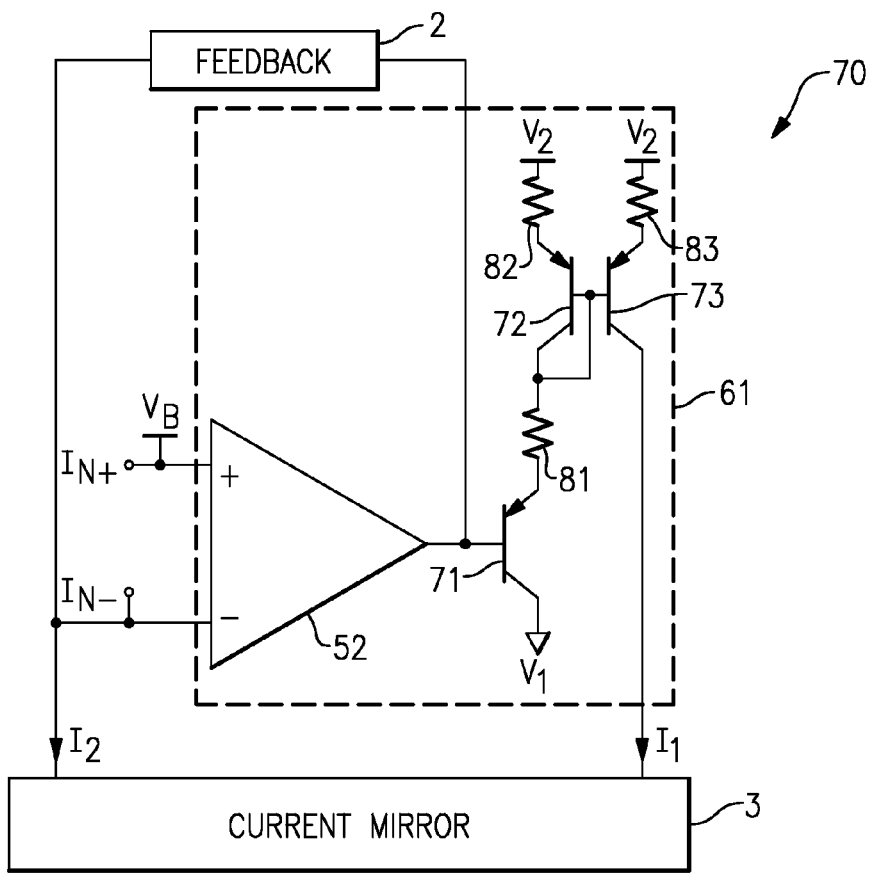
FIG. 5B is a circuit diagram of an amplifier according to another embodiment.

FIG. 5B is a circuit diagram of an amplifier 70 according to another embodiment. The amplifier 70 includes the first and second input terminals IN+, IN−, the feedback circuit 2, and the current mirror 3, which can be as described earlier. The amplifier 60 further includes an amplification circuit 61.

The amplification circuit 61 of FIG. 5B is similar to the amplification circuit 51 of FIG. 5A, except that the amplification circuit 61 illustrates a specific configuration of a transconductance circuit that includes first to third PNP bipolar transistors 71-73 and first to third resistors 81-83. The first PNP bipolar transistor 71 includes a collector electrically connected to the first voltage reference $V_1$, a base electrically connected to the voltage output of the operational amplifier 52, and an emitter electrically connected to a first end of the first resistor 81. The first resistor 81 further includes a second end electrically connected to a collector of the second PNP bipolar transistor 72 and to the bases of the second and third PNP bipolar transistors 72, 73. The second PNP bipolar transistor 72 further includes an emitter electrically connected to a second voltage reference $V_2$ through the second resistor 82. The third PNP bipolar transistor 73 further includes a collector configured to generate the first current $I_1$ and an emitter electrically connected to the second voltage reference $V_2$ thorough the third resistor 83.

The emitter current of the first PNP bipolar transistor 71 can change based on a voltage difference between the second voltage reference $V_2$ and the output voltage of the operational amplifier 52. Additionally, the emitter current can be mirrored using the second and third PNP bipolar transistors 72, 73 to generate the first current Although FIG. 5B illustrates one implementation of a transconductance circuit, other configurations are possible.

Figure 6A:
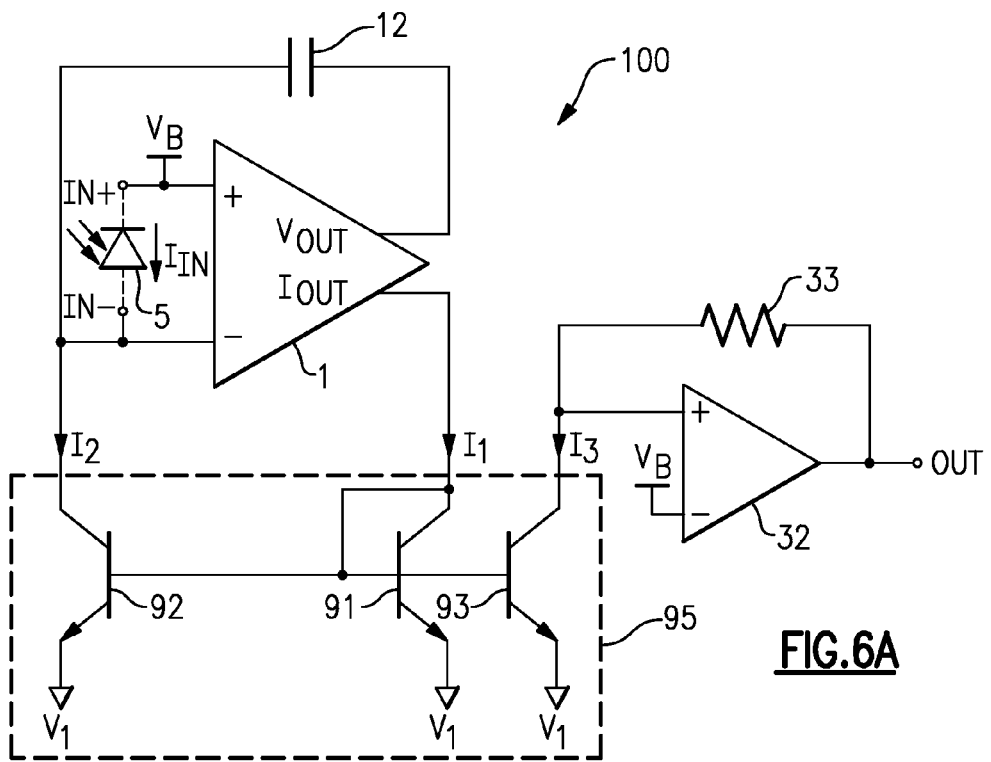
FIG. 6A is a circuit diagram of a transimpedance amplifier according to another embodiment.

FIG. 6A is a circuit diagram of a transimpedance amplifier 100 according to another embodiment.

The transimpedance amplifier 100 of FIG. 6A is similar to the transimpedance amplifier 40 of FIG. 4A, except that the transimpedance amplifier 100 illustrates a particular configuration of a feedback circuit and a current mirror. In particular, the transimpedance amplifier 100 includes a feedback capacitor 12 electrically connected between the voltage output $V_{OUT}$ and the inverting input of the amplification circuit 1. Additionally, the transimpedance amplifier 100 further includes a current mirror 95.

The current mirror 95 includes first, second, and third NPN bipolar transistors 91-93. The current mirror 95 is receives the first current $I_1$ from the amplification circuit 1, and can mirror the first current $I_1$ to generate the second and third currents $I_2$, $I_3$. The first NPN bipolar transistor 91 includes an emitter electrically connected to the first voltage reference $V_1$ and a base and collector electrically connected to the current output $I_{OUT}$ of the amplification circuit 1. The second NPN bipolar transistor 92 includes an emitter electrically connected to the first voltage reference $V_1$, a base electrically connected to the base of the first NPN bipolar transistor 91, and a collector configured to generate the second current $I_2$. The third NPN bipolar transistor 93 includes an emitter electrically connected to the first voltage reference $V_1$, a base electrically connected to the base of the first NPN bipolar transistor 91, and a collector configured to generate the third current $I_3$.

In certain implementations, a size or drive strength of the first NPN bipolar transistor 91 is selected to be larger than the size or drive strength of the second NPN bipolar transistor 92. Configuring the first and second NPN bipolar transistors 91, 92 in this manner can reduce a flow of current through the second NPN bipolar transistor 92 relative to the first NPN bipolar transistor 91, thereby helping to reduce the dynamic impedance of the first NPN bipolar transistor 91 and to improve performance at low input current levels.

The illustrated transimpedance amplifier 100 can have improved noise performance relative to certain conventional transimpedance amplifiers. For example, the current mirror 95 can have a gain used to amplify the third current $I_3$ relative to the first current $I_1$. The current mirror's gain can reduce the impact of the current noise contribution of the feedback resistor 33. Although the feedback configuration of the transimpedance amplifier 100 can also result in the second NPN bipolar transistor 92 having a shot noise that can change in relation to the square root of the magnitude of the input current $I_{IN}$, the illustrated transimpedance amplifier 100 can nevertheless have improved noise performance at relatively low input current levels.

The transimpedance amplifier 100 can have a substantially constant bandwidth in response to changes in the level of the input current $I_{IN}$. For example, in a manner similar to that described earlier with respect to FIG. 2, the transimpedance amplifier 100 can have a transfer function associated have a substantially constant bandwidth in response to changes in the level of the input current $I_{IN}$.

Accordingly, the transimpedance amplifier 100 can operate with substantially constant bandwidth across a range of input current levels. Thus, the transimpedance amplifier 100 can be well suited for a variety of applications, including, for example, amplification of photodiode photocurrent in low light conditions. In contrast, certain conventional transimpedance amplifiers can have a bandwidth that decreases at small input current levels, which can result in the transimpedance amplifier having insufficient bandwidth to amplify current pulses, such as those associated with pulse oximetry.

Additional details of the transimpedance amplifier 100 can be similar to those described earlier.

Figure 6B:
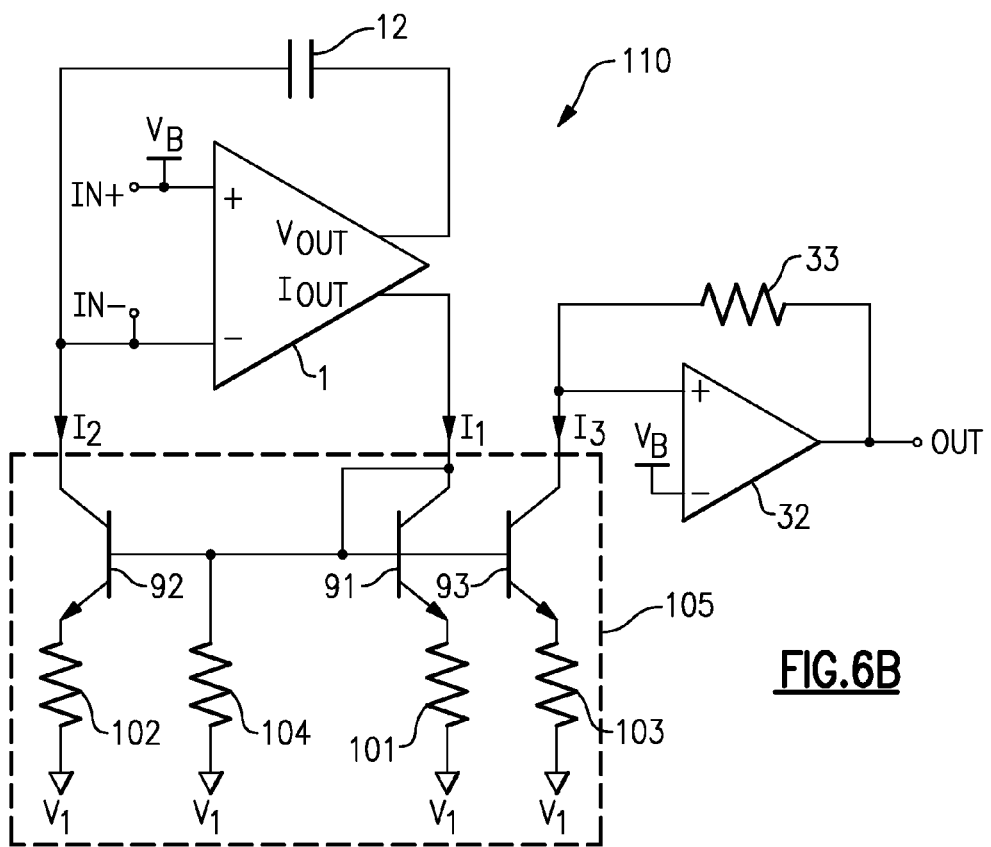
FIG. 6B is a circuit diagram of a transimpedance amplifier according to another embodiment.

FIG. 6B is a circuit diagram of a transimpedance amplifier 110 according to another embodiment.

The transimpedance amplifier 110 of FIG. 6B is similar to the transimpedance amplifier 100 of FIG. 6A, except that the transimpedance amplifier 110 of FIG. 6B includes a current mirror 105 rather than the current mirror 95. The current mirror 105 includes first to third NPN bipolar transistors 91-93, first to third degeneration resistors 101-103 and a stability resistor 104. The first degeneration resistor 101 is electrically connected between the emitter of the first NPN bipolar transistor 91 and the first voltage reference $V_1$. Additionally, the second and third degeneration resistors 102, 103 are electrically connected between the emitters of the second and third NPN bipolar transistors 92, 93, respectively, and the first voltage reference $V_1$. The stability resistor 104 is electrically connected between the base of the first NPN bipolar transistor 91 and the first voltage reference $V_1$.

The first to third degeneration resistors 101-103 can enhance the noise performance of the transimpedance amplifier 110 at high input current levels relative to the configuration shown in FIG. 6A. For example, the degeneration resistors 101-103 can reduce noise at high input current levels, such as shot noise of the first to third NPN bipolar transistors 91-93. Additional details related to the use of degeneration resistors to improve the noise performance of a current mirror can be found in "Noise characteristics of current mirror sinks/sources," by Alberto Bilotti and Eduardo Mariani, published in Volume 10, Issue 6 of the IEEE Journal of Solid-State Circuits (1975).

Although implementing the degeneration resistors 101-103 with a relatively high resistance can reduce noise, the presence of the degeneration resistors 101-103 also reduces the amplifier's voltage headroom. Accordingly, in certain implementations, the resistance of the degeneration resistors 101-103 can be selected to be relatively high to provide a large amount of noise reduction while being sufficiently small to meet voltage headroom specifications. For example, in one embodiment the transimpedance amplifier 110 is powered using a battery such as a coin cell, and the transimpedance amplifier 110 is configured to have voltage headroom sufficient to operate at a minimum battery voltage, for example, 2 V.

The first NPN bipolar transistor 91 is implemented in a diode-connected configuration, and thus can operate similar to a diode. In certain implementations, a size or drive strength of the diode-connected first NPN bipolar transistor 91 is selected to be larger than the size or drive strength of the second NPN bipolar transistor 92, which can reduce a flow of current through the second NPN bipolar transistor 92 relative to the first NPN bipolar transistor 91 to reduce the dynamic impedance of the first NPN bipolar transistor 91 and to improve performance at low input current levels.

The stability resistor 104 can be used to control the adaptive gain range of the transimpedance amplifier 110 in response to changes in the input current $I_{IN}$. For example, the parallel resistance of the stability resistor 104 and the first NPN bipolar transistor 91 can control a maximum gain associated with a transconductance of the amplification circuit 1 and an impedance of the current mirror 105.

Thus, the stability resistor 104 can limit the incremental resistance of the diode-connected first NPN bipolar transistor 91 for small amplifier input current levels. In one embodiment, the resistance of the stability resistor 104 is selected to be in the range of about 150 kΩ to about 500 kΩ. Although an example of suitable resistance values has been provided, other resistance values are possible, such as resistances that depend on a particular application and/or manufacturing process.

Figure 7:
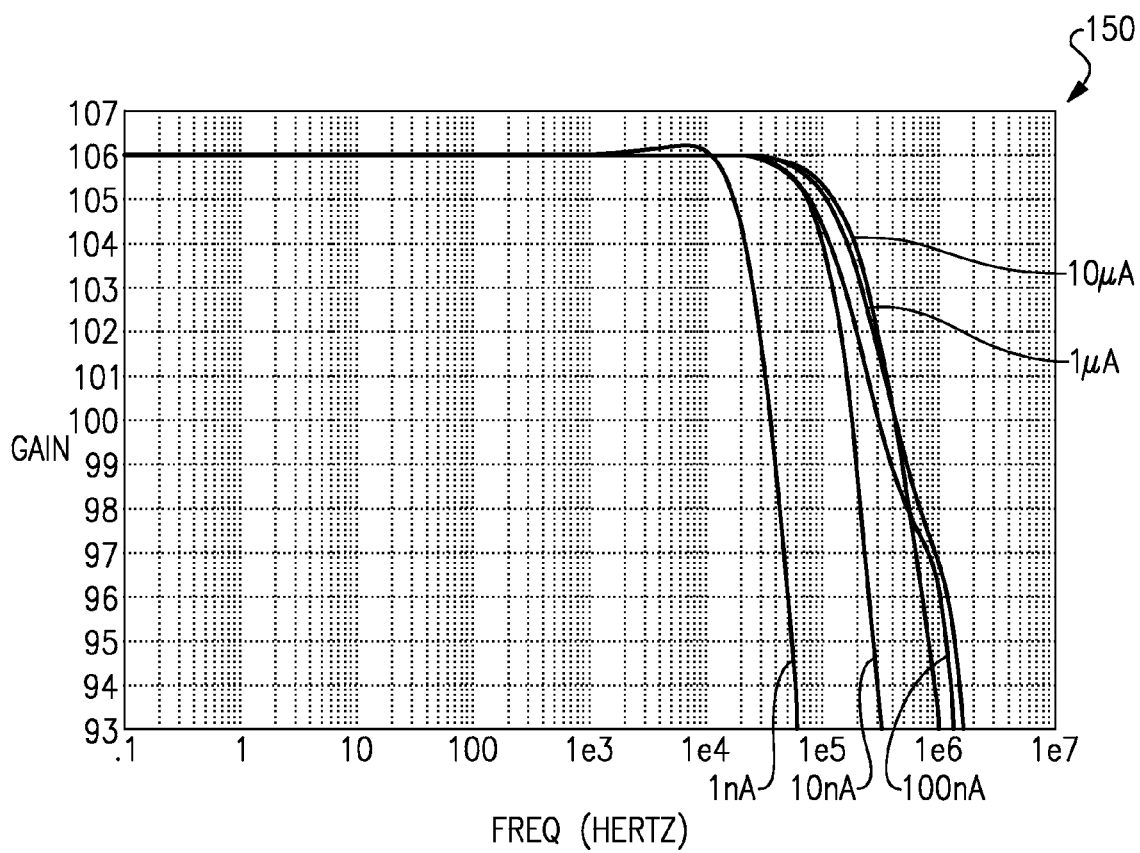
FIG. 7 is a graph of gain versus frequency for various input current levels for one implementation of an amplifier.

FIG. 7 is a graph 150 of gain versus frequency for various input current levels for one implementation of an amplifier. The graph 150 corresponds to one implementation of the transimpedance amplifier 110 of FIG. 6B.

As shown in FIG. 7, the gain of the transimpedance amplifier can decrease or roll-off with increasing frequency. However, the transimpedance amplifier can have a substantially constant bandwidth across a relatively wide range of input current levels extending between 10 nanoamps (nA) and microamps 10 (μA) in the illustrated example. At an input current of 1 nA, the bandwidth begins to decrease due to parasitic effects, but then only to about 25 kHz.

FIG. 8 is a graph 160 of current versus time for one implementation of an amplifier. The graph 160 corresponds to a simulation of one implementation of the transimpedance amplifier 110 of FIG. 6B. The graph 160 includes a first plot 161 of the input current $I_{IN}$ of versus time and a second plot 162 of the third current $I_3$ versus time.

The first plot 161 corresponds to an input current pulse associated with pulse oximetry, where rapid sampling of signal current versus ambient background current can be important. The current pulse begins at 1 ms and transitions from 10 nA to 10 μA and back to 10 nA, and can be associated with photocurrent of a photodiode in a low ambient light condition. As shown in FIG. 8, the amplifier can be used to reliably amplify such a current pulse. Although FIG. 8 illustrates simulation results for one implementation of the amplifier 110 of FIG. 8, other simulation results are possible, such as simulation results based on other implementations of the amplifier 110 and/or simulations using different circuit parameters or models.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Applications

Devices employing the above described schemes can be implemented into various electronic devices. For example, amplifiers can be used in consumer electronic products, parts of the consumer electronic products, and electronic test equipment. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, a global positioning system (GPS) device, a remote control device, a wireless network terminal, etc. Further, the electronic device can include unfinished products.

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An amplifier comprising:
   an amplification circuit comprising a first voltage input, a second voltage input, a voltage output, and a current output, wherein the amplification circuit is configured to control a voltage level of the voltage output by amplifying a voltage difference between the first and second voltage inputs, and wherein the amplification circuit is further configured to generate a first current on the current output based on the voltage difference between the first and second voltage inputs;

a feedback circuit electrically connected between the voltage output of the amplification circuit and the second voltage input of the amplification circuit;

a current mirror including a current input electrically connected to the current output of the amplification circuit and a first current output electrically connected to the second voltage input of the amplification circuit, wherein the current mirror is configured to receive the first current at the current input and to mirror the first current to generate a second current at the first current output;

a first input terminal electrically connected to the first voltage input of the amplification circuit; and a second input terminal electrically connected to the second voltage input of the amplification circuit, wherein the amplifier is configured to receive an input signal corresponding to an input current flowing between the first input terminal and the second input terminal.

2. The amplifier of claim 1, wherein the current mirror is configured to generate the second current so as to substantially equal the input current.

3. The amplifier of claim 1, wherein the amplifier is configured to operate with a substantially constant bandwidth irrespective of changes in a level of the input current.

4. The amplifier of claim 2, wherein the current mirror comprises a diode including an anode electrically connected to the current output of the amplification circuit and a cathode electrically connected to a first voltage reference, wherein the current mirror further comprises a bipolar transistor having an emitter electrically connected to the first voltage reference, a base electrically connected to the anode of the diode, and a collector electrically connected to the second voltage input of the amplification circuit.

5. An amplifier comprising:

an amplification circuit comprising a first voltage input, a second voltage input, a voltage output, and a current output, wherein the amplification circuit is configured to control a voltage level of the voltage output by amplifying a voltage difference between the first and second voltage inputs, and wherein the amplification circuit is further configured to generate a first current on the current output based on the voltage difference between the first and second voltage inputs;

a feedback circuit electrically connected between the voltage output of the amplification circuit and the second voltage input of the amplification circuit;

a current mirror including a current input electrically connected to the current output of the amplification circuit and a first current output electrically connected to the second voltage input of the amplification circuit, wherein the current mirror is configured to receive the first current at the current input and to mirror the first current to generate a second current at the first current output, wherein the current mirror comprises a diode including an anode electrically connected to the current output of the amplification circuit and a cathode electrically connected to a first voltage reference, wherein the current mirror further comprises a bipolar transistor having an emitter electrically connected to the first voltage reference, a base electrically connected to the anode of the diode, and a collector electrically connected to the second voltage input of the amplification circuit;

a first input terminal electrically connected to the first voltage input of the amplification circuit;

a second input terminal electrically connected to the second voltage input of the amplification circuit, wherein the amplifier is configured to receive an input current between the first and second input terminals, and wherein the current mirror is configured to generate the second current so as to substantially equal the input current; and an output terminal electrically connected to the anode of the diode, wherein a voltage of the output terminal is configured to change in relation to a logarithm of the input current.

6. The amplifier of claim 2, further comprising a current source configured to generate the input current, wherein the current source is electrically connected between the first input terminal and the second input terminal.

7. The amplifier of claim 6, wherein the current source comprises a photodiode, and wherein the input current comprises a photocurrent.

8. The amplifier of claim 1, wherein the amplification circuit comprises:

an operational amplifier including a first voltage input, a second voltage input, and a voltage output, wherein the first voltage input of the operational amplifier operates as the first voltage input of the amplification circuit, wherein the second voltage input of the operational amplifier operates as the second voltage input of the amplification circuit, and wherein the voltage output of the operational amplifier operates as the voltage output of the amplification circuit; and a transconductance circuit including a voltage input and a current output, wherein the voltage input of the transconductance circuit is electrically connected to the voltage output of the operational amplifier, and wherein the current output of the transconductance circuit is configured to generate the first current.

9. The amplifier of claim 1, wherein the feedback circuit comprises a feedback capacitor electrically connected between the voltage output of the amplification circuit and the second voltage input of the amplification circuit.

10. The amplifier of claim 1, wherein the first voltage input of the amplification circuit is configured to receive a bias voltage.

11. The amplifier of claim 10, further comprising a bias circuit configured to generate the bias voltage.

12. The amplifier of claim 1, wherein the current mirror further comprises a second current output, wherein the current mirror is further configured to mirror the first current to generate a third current at the second current output.

13. The amplifier of claim 12, further comprising:

an output terminal;

an output current mirror configured to mirror the third current to generate a fourth current;

an output resistor configured to receive the fourth current, wherein the output resistor is electrically connected between the output terminal and a first voltage reference.

14. The amplifier of claim 12, further comprising:

an output terminal;

an output amplification circuit comprising a first voltage input configured to receive a bias voltage, a second voltage input, and a voltage output electrically connected to the output terminal; and a feedback resistor configured to receive the third current, wherein the feedback resistor is electrically connected between the output terminal and the second voltage input of the output amplification circuit.

15. The amplifier of claim 12, wherein the current mirror comprises:
   a first bipolar transistor comprising an emitter electrically connected to a first voltage reference and a collector and a base electrically connected to the current output of the amplification circuit;
   a second bipolar transistor comprising an emitter electrically connected to the first voltage reference, a base electrically connected to the base of the first bipolar transistor, and a collector configured to generate the second current; and
   a third bipolar transistor comprising an emitter electrically connected to the first voltage reference, a base electrically connected to the base of the first bipolar transistor, and a collector configured to generate the third current.

16. The amplifier of claim 15, further comprising:
   a first degeneration resistor electrically connected between the emitter of the first bipolar transistor and the first voltage reference;
   a second degeneration resistor electrically connected between the emitter of the second bipolar transistor and the first voltage reference; and
   a third degeneration resistor electrically connected between the emitter of the third bipolar transistor and the first voltage reference.

17. The amplifier of claim 15, further comprising a stability resistor electrically connected between the base of the first bipolar transistor and the voltage reference.

18. An electronically-implemented method of amplification, the method comprising:
   receiving an input signal corresponding to an input current flowing between a first input terminal and a second input terminal of an amplifier;
   amplifying a voltage difference between the first input terminal and the second input terminal to generate an amplified voltage using an amplification circuit of the amplifier, wherein the amplification circuit comprises a first voltage input electrically connected to the first input terminal, a second voltage input electrically connected to the second input terminal, a voltage output for providing the amplified voltage, and a current output;
   generating a first current on the current output of the amplification circuit based on the voltage difference between the first input terminal and the second input terminal;
   providing voltage feedback from the voltage output of the amplification circuit to the second voltage input of the amplification circuit using a feedback circuit of the amplifier; and
   providing current feedback from the current output of the amplification circuit to the second voltage input of the amplification circuit by using a current mirror of the amplifier to mirror the first current to generate a second current substantially equal to the input current.

19. The method of claim 18, further comprising biasing the first voltage input of the amplification circuit using a bias voltage.

20. The method of claim 18, further comprising generating the input current using a photodiode that is electrically connected between the first input terminal and the second input terminal, wherein the input current comprises a photocurrent.

21. The method of claim 18, further comprising mirroring the first current to generate a third current.

22. The method of claim 21, further comprising converting the third current into an output voltage.

23. The method of claim 18, further comprising operating the amplifier with a substantially constant bandwidth irrespective of changes in a level of the input current.

* * * * *